(12) United States Patent
Jenne

(10) Patent No.: US 6,172,907 B1
(45) Date of Patent: Jan. 9, 2001

(54) SILICON-OXIDE-NITRIDE-OXIDE-SEMICONDUCTOR (SONOS) TYPE MEMORY CELL AND METHOD FOR RETAINING DATA IN THE SAME

(75) Inventor: Fred Jenne, Los Gatos, CA (US)

(73) Assignee: Cypress Semiconductor Corporation, San Jose, CA (US)

( * ) Notice: Under 35 U.S.C. 154(b), the term of this patent shall be extended for 0 days.

(21) Appl. No.: 09/426,100

(22) Filed: Oct. 22, 1999

(51) Int. Cl.$^7$ .................................................. G11C 16/04
(52) U.S. Cl. ........................ 365/185.18; 365/185.26; 365/185.14
(58) Field of Search ...................... 365/185.18, 185.26, 365/185.14

(56) References Cited

U.S. PATENT DOCUMENTS

| | | |
|---|---|---|
| 5,496,756 * | 3/1996 | Sharna et al. .................. 437/52 |
| 5,506,816 | 4/1996 | Hirose et al. . |
| 5,510,638 | 4/1996 | Lancaster et al. . |
| 5,644,533 | 7/1997 | Lancaster et al. . |
| 5,656,837 | 8/1997 | Lancaster et al. . |
| 5,760,644 | 6/1998 | Lancaster et al. . |
| 5,774,400 | 6/1998 | Lancaster et al. . |
| 5,789,776 | 8/1998 | Lancaster et al. . |
| 5,892,712 | 4/1999 | Hirose et al. . |
| 6,026,018 * | 2/2000 | Sharna et al. .................. 365/185.07 |

FOREIGN PATENT DOCUMENTS

| | | |
|---|---|---|
| WO 95/30244 | 11/1995 | (WO) . |
| WO 97/15929 | 5/1997 | (WO) . |

\* cited by examiner

Primary Examiner—David Nelms
Assistant Examiner—Connie C. Yoha
(74) Attorney, Agent, or Firm—Bradley T. Sako

(57) ABSTRACT

According to one embodiment, a nonvolatile storage circuit (100) can include a volatile portion (102) that includes p-channel metal-oxide-semiconductor (MOS) transistors (106-0 and 106-1) and n-channel MOS (NMOS) transistors (108-0 and 108-1) arranged in a complementary MOS (CMOS) latch configuration. Also included are nonvolatile devices (116-0 and 116-1) disposed between PMOS transistor 106-0 and NMOS transistor 108-0, and between PMOS transistor 106-1 and NMOS transistor 108-1. Nonvolatile devices (116-0 and 116-1) can include silicon-oxide-nitride-semiconductor (SONOS) transistors that can be programmed to opposite states to recall a logic value when power is applied to the nonvolatile storage circuit (100). In a read mode, a bias voltage VBIAS can be applied to nonvolatile devices (116-0 and 116-1) that tends to retain charge in both nonvolatile devices (116-0 and 116-1).

20 Claims, 2 Drawing Sheets

SILICON-OXIDE-NITRIDE-OXIDE-SEMICONDUCTOR (SONOS) TYPE MEMORY CELL AND METHOD FOR RETAINING DATA IN THE SAME

TECHNICAL FIELD

The present invention relates generally to nonvolatile semiconductor devices, and more particularly to nonvolatile data storage circuits.

BACKGROUND OF THE INVENTION

Semiconductor data storage structures can include volatile circuits, such as latch circuits included in conventional static random access memories (SRAMs). Such latches can include four transistor (4-T) cells and six transistor (6-T) cells, as just two examples. Data storage structures can also include nonvolatile circuits, such as those included in erasable programmable read-only-memories (such EPROMs, conventional EEPROMs, and "flash" EEPROMs). As is well understood, a nonvolatile circuit can retain its stored data in the absence of power. Conversely, volatile circuits will lose stored data in the absence of power.

Typically, conventional volatile circuits may provide a more rapid response than nonvolatile circuits. Thus, memory devices formed with conventional volatile circuits may have faster read times.

Most commercial environments can allow conventional volatile circuits to operate with acceptable reliability. However, some environments, such space and/or high-earth orbit, are not conducive to the reliability of volatile circuit operation. Without the protection of an atmosphere, various events can occur with increased frequency that may disturb the operation of a semiconductor device. Such events can include bursts of gamma radiation and/or single particle events (also referred to as random event upset or single event upset). Such radiation/particles can generate electron-hole pairs within a semiconductor substrate, temporarily injecting current into nodes within the volatile circuits. This may undesirably alter the potential at such circuit nodes. In a bi-stable circuit, like a conventional latch, such a disturb can cause the latch to "flip," and thus store erroneous data.

One approach that may provide both rapid operation and a form of nonvolatility is to modify a conventional latch with nonvolatile elements. Such volatile-nonvolatile hybrid circuits can allow the data stored within the latch to be "programmed." Once programmed, such circuits may be more resistant to disturb events. Further, in the event power is lost, when power is reapplied, the latch will power-up with the programmed data values. Similarly, if erroneous operation occurs due to a radiation/particle induced event, the circuit can be "reset" by removing and then reapplying power to restore correct data values.

One example of a storage circuit that includes volatile and nonvolatile elements is set forth in FIG. 3. FIG. 3 is an eight transistor (8-T) metal-nitride-oxide-semiconductor (MNOS) latch. The 8-T MNOS latch is designated by the general reference character 300, and is shown to have a 6-T volatile latch arrangement with two additional MNOS transistors.

MNOS transistors can include an insulated gate field effect structure having a metal gate separated from a semiconductor substrate by a silicon nitride ("nitride")/silicon dioxide ("oxide") layer. A MNOS transistor can operate in a nonvolatile fashion by trapping charge at the nitride/oxide interface. For example, an MNOS transistor can be "erased" by applying an electric field across the nitride/oxide interface that can result in electrons tunneling from the interface to a substrate and/or "holes" tunneling into the interface. In the case of an n-channel MNOS transistor, such an operation can lower the threshold voltage of the transistor. Conversely, an MNOS transistor can be programmed by applying an opposite electric field across the interface. Electrons can tunnel into the interface and/or holes can tunnel from the interface. In the case of an n-channel MNOS transistor, such an operation can raise the threshold voltage of the transistor.

A drawback to MNOS transistors is that such devices can have a relatively high programming and/or erase voltage. As but one example, the electric field for erasing and programming an MNOS transistor can be +/−15 volts.

Unfortunately, higher voltage semiconductor devices must often include specialized structures. For example, MOS devices must be formed within specialized high voltage wells that can have particular doping profiles, including double and/or triple diffused wells. Further, sources and drains may also be double diffused. Such devices may further include specialized insulating arrangements.

Specialized high-voltage structures may not be readily "scalable." That is, as manufacturing processes improve, conventional devices (such as transistors) are scalable, as they can be shrunk with each new generation. Scalable structures may thus reduce the overall cost in manufacturing a semiconductor device. However, higher-voltage structures, such as those used to program and/or erase MNOS transistors can remain unduly large, adding to the size of the overall device and/or requiring portions that must be customed designed. As just one example, double and triple diffused wells can push out spacing requirements in lateral and/or vertical directions. Such structures may add to the expense and complexity in a manufacturing process.

Further, in the event a higher programming and/or erase voltage is generated "on-chip" more circuit area can be required. As just one example, more charge pump stages may be used to generate a higher programming and/or erase voltage than a lower programming and/or erase voltage.

Referring back to FIG. 3, a conventional 8-T MNOS latch 300 can include an n-channel metal-oxide-semiconductor (NMOS) transistor 302 and a p-channel MOS (PMOS) transistor (PMOS) 304 that form a first pair. A first pair can be cross-coupled with a second pair that includes NMOS transistor 306 and PMOS transistor 308. The gates of NMOS and PMOS transistors 306 and 308 can be commonly coupled to a first data node 310. The gates of NMOS and PMOS transistors 302 and 304 can be commonly coupled to a second data node 312. Data nodes 310 and 312 can be connected to complementary bit lines 314 and 316 by NMOS pass transistors 318 and 320, respectively. The gates of NMOS pass transistors 318 and 320 can be commonly connected to a word line WL. The sources of PMOS transistors 304 and 308 can be commonly connected to a high power supply voltage VCC. The sources of NMOS transistors 302 and 306 can be commonly connected to a low supply voltage VSS (e.g., "grounded").

Unlike a conventional complementary MOS latch circuit, an 8-T MNOS latch may also include an n-channel MNOS transistor 322 having a source-drain path connected between the drains of NMOS transistor 302 and PMOS transistor 304. Another n-channel MNOS transistor 324 can have a source-drain path connected between the drains of NMOS transistor 306 and PMOS transistor 308. The gates of MNOS transistors (322 and 324) can be commonly coupled to a program voltage VP or a high power supply voltage VCC.

A form of nonvolatility can be introduced into the 8-T MNOS latch 300 by programming MNOS transistors (322 and 324) to opposite states. As just one example, MNOS transistor 322 can be programmed to an erased state, while MNOS transistor 324 can be programmed to a programmed state. In such an arrangement, as power is applied to the circuit, an MNOS transistor 322 may have a low impedance path with respect to MNOS transistor 324. Transistor 324 can have a high impedance path with respect to MNOS transistor 322. First data node 310 can rise to the VCC potential while second data node 312 can fall to the VSS potential. Obviously, if MNOS transistor 322 was in a programmed state and MNOS transistor 324 was in an erased state, an 8-T MNOS latch 300 could power-up into the opposite logic state (first data node 310 low, second data node 312 high).

As shown in FIG. 3, the gates of MNOS transistors (322 and 324) can also be connected to a high power supply voltage VCC. This connection can occur in a power-up operation and a read operation. A drawback to such an arrangement is that a field can be formed across the MNOS transistors (322 and 324) that can contribute to charge leakage, and may thus reduce overall data retention time in the MNOS transistors (322 and 324). As just one example, a high power supply voltage VCC on the gate of an erased MNOS transistor can generate a field across the nitride/oxide interface that may assist electron transport to the nitride/oxide interface, thereby undesirably increasing the threshold voltage of the MNOS transistor.

While the arrangement of FIG. 3 describes an 8-T MNOS latch 300 that includes n-channel MNOS devices, such an arrangement can alternatively include p-channel MNOS devices. In a read operation, the gates of p-channel MNOS devices can be coupled to a low power supply voltage VSS. Such a low power supply voltage can also generate a field across the nitride/oxide interface that may reduce data retention times in such p-channel MNOS devices.

In light of the above drawbacks that may be inherent in conventional 8-T MNOS latch circuits, it would be desirable to arrive at a nonvolatile storage structure that can be more compatible with modern scaled process technologies.

It would also be desirable arrive at a nonvolatile storage structure that may improve nonvolatile data retention times.

It would further be desirable arrive at a nonvolatile storage structure that includes nonvolatile elements that may be programmable at a lower voltage than prior art approaches.

SUMMARY OF THE INVENTION

According to one embodiment of the present invention, a nonvolatile storage circuit can include nonvolatile devices that can establish a logic value when a power supply voltage is applied to the circuit. In addition, a bias voltage can be applied to nonvolatile devices that tends to retain charge stored therein.

According to one aspect of the embodiments, nonvolatile devices can include silicon-oxide-nitride-oxide-semiconductor (SONOS) type transistors.

According to another aspect of the embodiments, a bias voltage can be less than a power supply voltage.

According to another aspect of the embodiments, a nonvolatile storage circuit can include a volatile portion that can latch a data value according to the states of nonvolatile devices when power is applied to the nonvolatile storage circuit.

According to another aspect of the embodiments, nonvolatile devices can be programmed to an erased state or a programmed state. The bias voltage can tend to retain charge in nonvolatile devices in both the programmed and erased states.

DETAILED DESCRIPTION OF THE EMBODIMENTS

Figure 1:
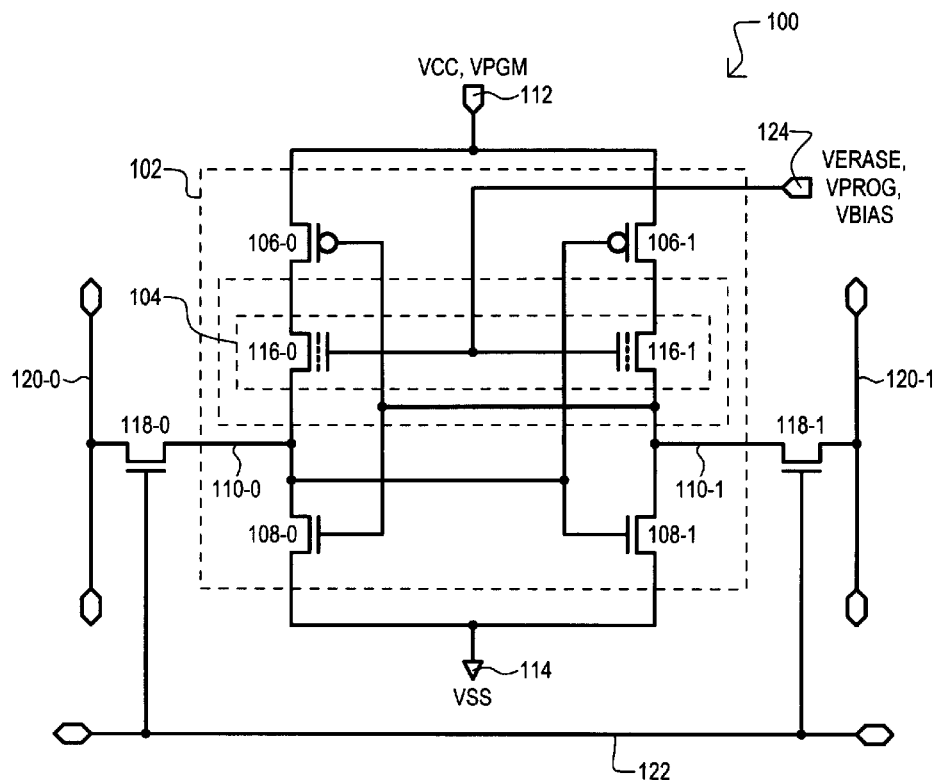
FIG. 1 is a schematic diagram of one embodiment.

Various embodiment of the present invention will now be described in conjunction with a number of diagrams. Referring now to FIG. 1, a nonvolatile storage circuit is shown in a schematic diagram and designated by the general reference character 100. A nonvolatile storage circuit 100 can include a volatile portion 102 and a nonvolatile portion 104. A volatile portion 102 can include volatile devices arranged to store a data value. A nonvolatile portion 104 can include nonvolatile devices that can retain a logic state within the nonvolatile circuit 100 in the absence of power to a nonvolatile storage circuit 100.

A volatile portion 102 can include p-channel metal-oxide-semiconductor (MOS) store transistors (PMOS) 106-0 and 106-1 and n-channel MOS (NMOS) store transistors 108-0 and 108-1. It is understood that while transistors are referred to herein as MOS transistors, such transistors may also include various other forms of transistors. To name but a few limited examples, a volatile portion may include other types of field effect transistors and/or bipolar transistors.

A volatile portion 102 may further include complementary data nodes 110-0 and 110-1 that can provide complementary data values in a read operation. PMOS store transistors (106-0 and 106-1) can provide controllable impedance paths between a first power supply node 112 and data nodes 110-0 and 110-1, respectively. NMOS store transistors (108-0 and 108-1) can provide controllable impedance paths between a second power supply node 114 and data nodes 110-0 and 110-1, respectively.

The gates of NMOS transistor 108-0 and PMOS transistor 106-0 can be commonly coupled to data node 110-1. The gates of NMOS transistor 108-1 and PMOS transistor 106-1 can be commonly coupled to data node 110-0.

A nonvolatile portion 104 may include a first nonvolatile device 116-0 and a second nonvolatile device 116-1. Preferably, a nonvolatile device (116-0 and/or 116-1) can be a silicon-oxide-nitride-oxide-semiconductor (SONOS) transistor. A SONOS transistor can have the general configuration of an insulated gate field effect transistor, including a polysilicon gate separated from a semiconductor substrate by a dielectric layer. Such a dielectric layer can include a layer of silicon nitride (nitride) sandwiched between layers of silicon dioxide (oxide). It is understood that a SONOS device is not necessarily limited to a device having a polysilicon transistor gate. Such devices may also include gates formed from a metal and/or silicide and/or various combinations thereof, to name a few examples. Further, a dielectric layer may include a tunnel dielectric other than oxide, and a charge storage dielectric layer other than nitride.

A SONOS or SONOS-type device can be programmed by establishing an electric field across an ONO dielectric layer. In the presence of such a field, charge may be stored in traps present within a nitride layer and the threshold voltage of the SONOS device can be adjusted. In one particular arrangement, a field can be generated across a dielectric layer and electrons and/or holes can tunnel through an oxide layer to the nitride layer.

A SONOS transistor may have a lower programming voltage than some other nonvolatile devices, such as MNOS transistors. As just a few examples, a SONOS transistor may be programmed and/or erased with a potential between a SONOS transistor gate and a substrate of about 8 to 12 volts, relative to other nonvolatile technology at 12 to 24 volts. Such a lower programming potential can result in a nonvolatile storage circuit that may be more easily scalable with existing manufacturing processes.

A lower program and/or erase voltage may also lead to a more compact overall integrated circuit. As noted above, such higher-than-supply voltages can be generated on an integrated circuit by voltage generating circuits that can include charge pump circuits, or the like. A lower program and/or erase voltage may result in a charge pump circuit having fewer stages. Also, isolation spacing for high voltage junctions can be reduced, again saving area and therefore reduced cost.

A first nonvolatile device 116-0 can have a programmable impedance path disposed between data node 110-0 and a first power supply node 112. In the particular arrangement of FIG. 1, a first nonvolatile device 116-0 may be a depletion mode n-channel SONOS transistor with a source-drain path disposed between data node 110-0 and a drain of PMOS transistor 106-0. In this way, a first nonvolatile device 116-0 can provide a programmable impedance path between data node 110-0 and a first power supply node 112.

A second nonvolatile device 116-1 can have a programmable impedance path disposed between data node 110-1 and a first power supply node 112. In the particular arrangement of FIG. 1, a second nonvolatile device 116-1 may be a depletion mode n-channel SONOS transistor with a source-drain path disposed between data node 110-1 and a drain of PMOS transistor 106-1. In this way, a second nonvolatile device 116-1 can provide a programmable impedance path between data node 110-1 and first power supply node 112.

It is understood that while the circuit of FIG. 1 includes nonvolatile devices disposed between data nodes 110-0 and 110-1, the present invention could include other arrangements. As but one example, nonvolatile devices could be disposed between data nodes 110-0 and 110-1 and a second power supply node 114.

Data values may be read from complementary data nodes 110-0 and 110-1 by way of access devices 118-0 and 118-1, respectively. Access devices 118-0 and 118-1 may provide controllable impedance paths between their respective data nodes (110-0 and 110-1) and corresponding data lines 120-0 and 120-1. Access devices (118-0 and 118-1) can include NMOS transistors having source-drain paths coupled between their respective data nodes and corresponding data lines. The impedance of access devices (118-0 and 118-1) can be commonly controlled by a control line 122.

A nonvolatile storage circuit 100 may be a memory cell that can be repeated in rows and/or columns to form a memory cell array. In such an arrangement, data lines (120-0 and 120-1) may be complementary bit lines that can be coupled to memory cells of the same column, and control line 122 may be a word line that can be coupled to memory cells of the same row.

It is understood that while FIG. 1 includes complementary data lines (120-0 and 120-1), alternate approaches of the present invention may include a "single-sided" storage circuit. In such an arrangement a single data line can be coupled to a data node by an access device.

Nonvolatile devices 116-0 and 116-1 may be coupled to a nonvolatile supply node 124. A nonvolatile supply node 124 can receive a mode dependent voltage. In an erase mode, a nonvolatile supply node 124 can receive an erase voltage VERASE. An erase voltage VERASE can establish a field in a nonvolatile device that can move charge to place such a device into an erased state. In one particular case, an erase voltage VERASE can be applied to the gates of SONOS devices that induces hole tunneling from a substrate to a nitride layer within an ONO dielectric. Preferably, an erase voltage VERASE can be in the general range of −8 to −12 volts. An erase voltage VERASE can be applied according to well-understood nonvolatile programming techniques. As just one example, an erase voltage can be applied as a series of pulses.

In a program mode, a nonvolatile supply node 124 can receive a programming voltage VPROG. A program voltage VPROG can establish an electric field in a nonvolatile device that can move charge to place such a device into a programmed state. In one particular case, a program voltage VPROG can be applied to the gates of n-channel depletion mode SONOS devices. A program voltage VPROG can induce electron tunneling from a substrate to a nitride layer within an ONO dielectric. Preferably, a program voltage VPROG can be in the general range of +8 to +12 volts.

In a read mode, a nonvolatile supply node 124 can receive a bias voltage VBIAS. A bias voltage VBIAS can establish an electric field in a nonvolatile device that can tend to retain stored charge in place for both nonvolatile devices 116-0 and 116-1. In one particular case, a bias voltage VBIAS can be applied to the gates of n-channel depletion mode SONOS devices that may tend to hold trapped electrons in place in a programmed SONOS device, and tend to hold trapped holes in place in an erased SONOS device. Preferably, a bias voltage VBIAS can be a value between power supply voltages (such as VSS or VCC), more preferably VBIAS can be in the range of ¼ VCC to ¾ VCC. A VBIAS voltage may be a function of a device's charge retention characteristics.

A first power supply node 112 can also receive a mode dependent voltage. In a program mode, a first power supply node 112 can receive a programming set voltage VPGM. A programming set voltage VPGM may be larger than a power supply voltage VCC. A programming set voltage can establish a substrate potential in a nonvolatile device that can inhibit programming of the nonvolatile device. In one particular case, a program set voltage VPGM can be applied to the source and drain of an n-channel depletion mode SONOS device while the gate of the SONOS device receives a program voltage (such as VPROG). In such an arrangement, an electric field across an ONO dielectric can be reduced, inhibiting substantial tunneling from taking place.

In a read mode, a first power supply node 124 can receive a high power supply voltage VCC. One data node (110-0 or 110-1) may be coupled to a high power supply voltage VCC according to the state of nonvolatile devices (such as 116-0 or 116-1). Another data node may be coupled to a low power supply voltage VSS according to the state of nonvolatile devices (such as 116-0 or 116-1)

Having described the general arrangement of a nonvolatile storage circuit 100, various operations of such a nonvolatile storage circuit 100 will now be described.

Initially, nonvolatile devices (116-0 and 116-1) within a nonvolatile storage circuit 100 may be erased. An erase operation may include applying an erase voltage VERASE to a nonvolatile supply node 124. In the event nonvolatile devices (116-0 and 116-1) include n-channel depletion mode SONOS transistors, holes can tunnel into, and be trapped within, a nitride portion of an ONO dielectric. In one particular arrangement, a resulting depletion threshold voltage VTD for an erased nonvolatile device (116-0 and 116-1) can be greater than ½ VCC. As will be described below, such a threshold voltage can allow an erased nonvolatile device (116-0 and 116-1) to remain conductive when a charge retaining bias voltage VBIAS is applied.

With both nonvolatile devices (116-0 and 116-1) erased, a logic value can be applied to a nonvolatile storage circuit 100. In the particular arrangement of FIG. 1, a logic value can be applied by driving data lines 120-0 and 120-1 to opposite potentials and then activating a control line 122. An active control line 122 can turn on access devices 118-0 and 118-1. This can provide a low impedance path between data line 120-0 and data node 110-0, and a low impedance path between data line 120-1 and data node 110-1. With complementary data values applied at data nodes 110-0 and 110-1, a nonvolatile storage circuit 100 can latch the data value. Control line 122 can be deactivated, and the data value can remain stored in the nonvolatile storage circuit 100. One data node 110-0 may be latched at a high power supply voltage VCC while another data node 110-1 may be latched at a low power supply voltage VSS.

With a data value latched, the potential of a first power supply node 112 can be raised to a program set voltage VPGM. Such an increase in potential at the first power supply node 112 can result in a corresponding rise in potential at a data node. As just one example, if data node 110-0 was previously at a high power supply voltage VCC, it will now be at a program set voltage VPGM. If data node 110-1 was previously at the low power supply voltage VSS, it will remain at such a voltage. It is noted that in the particular example described above, if nonvolatile devices (116-0 and 116-1) include SONOS transistors, a source and drain of nonvolatile device 116-0 can be raised from a first power supply voltage VCC to a program set voltage VPGM. A source and drain of nonvolatile device 116-1 can remain at a second power supply voltage VSS. In this way a data value can be latched at a program set voltage VPGM. Further, one nonvolatile device (116-0 or 116-1) can be set to a program set voltage VPGM, while another nonvolatile device (116-1 or 116-0) can be set to a second power supply voltage VSS.

With a data value now latched at a program set voltage VPGM, a nonvolatile supply node 124 can receive a program voltage VPROG. Thus, one nonvolatile device (116-0 or 116-1) may receive the program voltage VPROG and a program set voltage VPGM, while the other nonvolatile device (116-1 or 116-0) may receive the program voltage VPROG and a low power supply voltage VSS.

In a programming operation, in the event nonvolatile devices (116-0 or 116-1) include n-channel depletion mode SONOS transistors, one SONOS transistor can receive a program voltage VPROG at its gate while its source and drain are at a program set voltage VPGM. In such an arrangement, the electric field across an ONO dielectric may not induce substantial tunneling of electrons, and the SONOS transistor can remain in an erased state. However, another SONOS transistor can receive a program voltage VPROG at its gate while its source, drain, and body are at a low power supply voltage VSS. In such an arrangement, the electric field across an ONO dielectric may induce substantial tunneling of electrons, and the SONOS transistor can be programmed, increasing its threshold voltage. In this way, nonvolatile devices can be programmed to opposite states to store a data value. Further, programming of one nonvolatile device can be essentially inhibited by applying a program set voltage VPGM that is higher than a first power supply voltage VCC.

Once nonvolatile devices (116-0 and 116-1) have been subjected to a programming step, a first power supply node 112 can return to a first power supply voltage VCC. In addition, a nonvolatile supply node 124 can receive a bias voltage VBIAS. In one particular arrangement, a bias voltage VBIAS can be ½ VCC. It is noted that a bias voltage of ½ VCC can help retain charge in nonvolatile devices.

It is noted that in a conventional approach, the gates of a nonvolatile device can receive a power supply voltage, such as VCC or VSS. Such an arrangement, can help retain charge in either the programmed or erased nonvolatile device, but not both. The approach of the described embodiment can simultaneously enhance data retention in both programmed and erased nonvolatile devices.

Figure 2A:
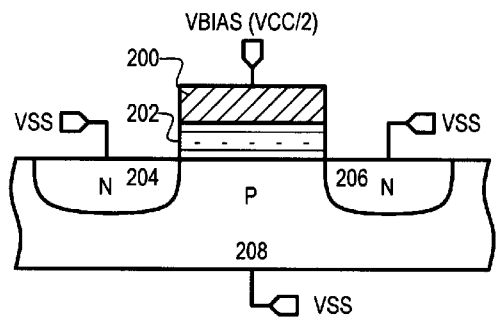
FIGS. 2A and 2B are diagrams illustrating a charge retention bias voltage according to one embodiment.
Figure 2B:
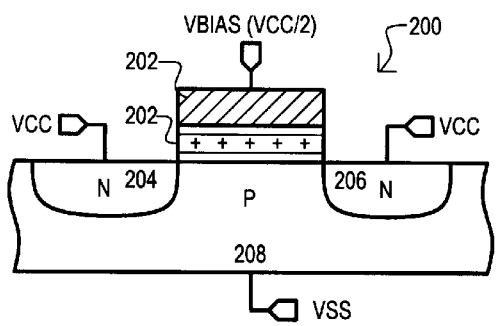
Figure 3:
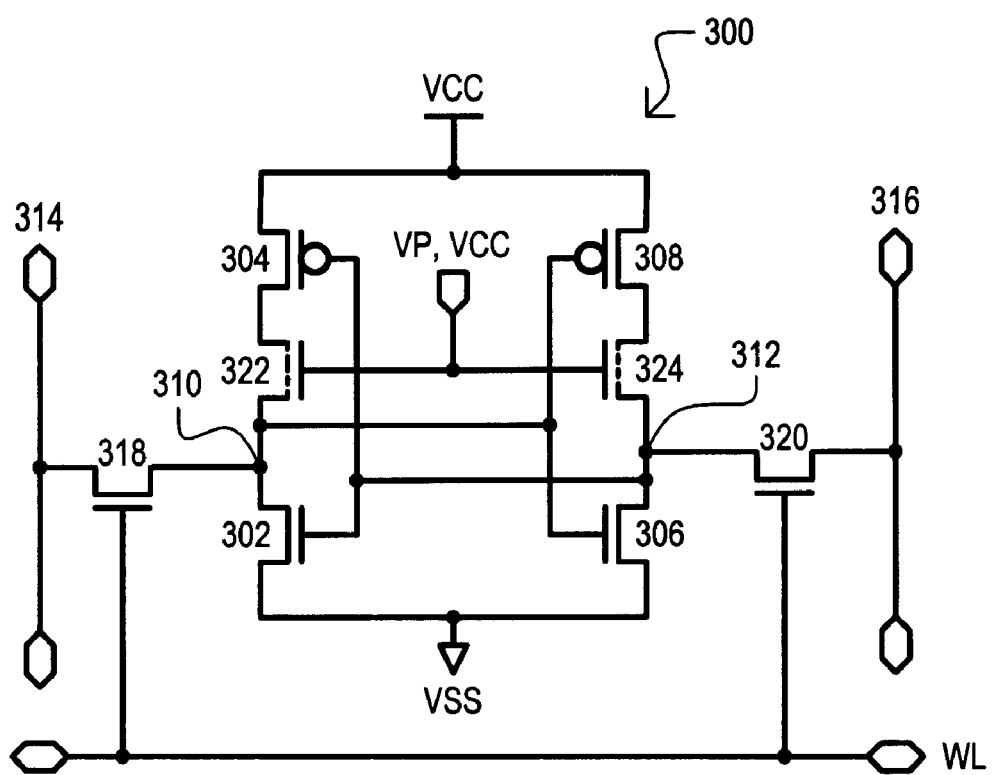
FIG. 3 is a schematic diagram of a conventional eight-transistor (8-T) metal-nitride-oxide-semiconductor latch.

Referring now to FIGS. 2A and 2B, side cross-sectional diagrams of SONOS transistors can illustrate charge retention characteristics of bias voltage VBIAS. It is understood that FIGS. 2A and 2B are intended to be illustrative and are not proportionately scaled. FIG. 2A is a side cross-sectional view of a SONOS transistor in a programmed state. FIG. 2B is a side cross-sectional view of a SONOS transistor in an erased state. Both SONOS transistors can include a gate 200, an ONO dielectric 202, a source 206, a drain 206 and a body 208. It is understood that a body can include a bulk p-type substrate, an epitaxial layer, a p-well formed within an n-type substrate, or a p-well formed within an n-type well, to name just a few examples.

Referring to FIG. 2A, in a read mode a programmed SONOS transistor can receive a bias voltage VBIAS at its gate 200, while its source 204, drain 206 and body 208 are at a low power supply voltage VSS. Consequently a low positive electric field is established across an ONO dielectric 202 that tends to hold negative charge, such as electrons, in place.

Referring to FIG. 2B, in a read mode an erased SONOS transistor can receive a bias voltage VBIAS at its gate 200, while its source 204 and drain 206 are at a high power supply voltage VCC and its body 208 is at a low power supply voltage VSS. Consequently a low negative electric field is established across an ONO dielectric 202 that tends to hold positive charge, such as "holes," in place.

It is further noted that erasing SONOS transistors (such as that set forth in FIG. 2B) to depletion threshold voltages that are greater than ½ VCC, can prevent a bias voltage VBIAS of ½ VCC from turning off the SONOS transistor in a read operation.

It is understood that while a preferred embodiment can include SONOS transistors with advantageously low programming voltages, the present invention is not necessarily limited to such an arrangement. As just one example, alternate embodiments can include other nonvolatile storage circuits having a charge retaining bias voltage applied during a standard access operation (such as a read operation).

Further, while various embodiments have been described with reference to a high power supply voltage VCC and a low power supply voltage VSS, such voltages are not necessarily supplied from an external source. A nonvolatile storage circuit according to the present invention could operate with an internal "stepped down" power supply voltage. In such an arrangement, a power supply voltage for a nonvolatile storage circuit can be less than an externally applied power supply voltage.

Still further, while the particular disclosed embodiments illustrate a nonvolatile storage circuit having a particular volatile portion, other volatile portion of different designs may be utilized in alternate embodiments.

Thus, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A nonvolatile storage circuit, comprising:

a first nonvolatile device that includes a first alterable impedance path, said first nonvolatile device coupled between a first data node and a first power supply;

a second nonvolatile device that includes a second alterable impedance path, said second nonvolatile device coupled between a second data node and the first power supply; and the first and second nonvolatile devices being coupled to a bias voltage between a first power supply voltage and a second power supply voltage in a first mode.

2. The nonvolatile storage circuit of claim 1, wherein:

the first and second nonvolatile devices include a substrate portion, a gate, and a dielectric disposed between the substrate and the gate, the dielectric including a charge trapping layer disposed therewithin.

3. The nonvolatile storage circuit of claim 2, wherein:

the dielectric comprises a first insulating layer containing silicon dioxide and the charge trapping insulating layer comprises silicon nitride.

4. The nonvolatile storage circuit of claim 3, wherein:

the dielectric further comprises a second insulating layer containing silicon dioxide.

5. The nonvolatile storage circuit of claim 4, wherein:

the nonvolatile devices are depletion mode silicon-oxide-nitride-oxide semiconductor (SONOS) transistors having a depletion threshold voltage, the difference between the first power supply voltage and the bias voltage being less than the depletion threshold voltage.

6. The nonvolatile storage circuit of claim 2, wherein:

the nonvolatile storage circuit includes a read mode that can access at least one data node; and the first and second nonvolatile devices can be programmed to store charge and provide different impedance responses, the gates of the first and second nonvolatile devices being coupled to the bias voltage in the read mode, the bias voltage tending to retain charge in both nonvolatile devices.

7. The nonvolatile storage circuit of claim 1, further including:

a first controllable impedance path coupled between the first data node and a second power supply node; and a second controllable impedance path coupled between the second data node and the second power supply node.

8. The nonvolatile storage circuit of claim 7, wherein:

the first controllable impedance path includes a first field effect transistor having a source-drain path coupled between the first data node and the second power supply node and a gate coupled to the second data node; and the second controllable impedance path includes a second field effect transistor having a source-drain path coupled between the second data node and the second power supply node and a gate coupled to the first data node.

9. A circuit, comprising:

first and second charge storing nonvolatile devices that can be programmed into at least a first state or a second state, the first and second charge storing nonvolatile devices establishing a logic value in the circuit and receiving a bias voltage that is a fraction of a power supply voltage for the circuit and that tends to retain stored charge levels in the first and second states.

10. The circuit of claim 9, wherein:

the first and second nonvolatile devices include a substrate portion, a gate, and a dielectric disposed between the substrate portion and the gate, the dielectric including a first insulating layer, a second insulating layer, and a charge trapping insulating layer disposed between the first and second insulating layers.

11. The circuit of claim 9, wherein:

the circuit can receive a first power supply voltage and a second power supply voltage; and the bias voltage is less than the first power supply voltage and greater than the second power supply voltage.

12. The circuit of claim 9, wherein:

the first nonvolatile device is coupled to a first data node;

the second nonvolatile device is coupled to a second data node; and the first and second nonvolatile devices can have a first impedance response in the first state and a second impedance response in the second state.

13. The circuit of claim 12, further including:

a first controllable impedance path coupled between the first data node and a second supply node, the impedance of the first controllable impedance path being controlled by the potential at the second data node; and a second controllable impedance path coupled between the second data node and the second supply node, the impedance of the second controllable impedance path being controlled by the potential at the first data node.

14. A nonvolatile storage circuit, comprising:

a first power supply node that receives a first power supply potential in a read mode and a second power supply node that receives a second power supply potential in the read mode; and at least two nonvolatile devices programmable to opposing states and providing different impedance responses in opposing states, each nonvolatile device being coupled to a nonvolatile supply node that receives a program potential in a program mode and a bias potential in a read mode, the bias potential being less than the first power supply voltage and greater than the second power supply voltage.

15. The circuit of claim 14, wherein:

the program potential is greater in magnitude than the power supply potential.

16. The circuit of claim 14, wherein:

the program potential is in the general range of +8 to +12 volts.

17. The circuit of claim 14, wherein:

the program potential is a positive potential; and the nonvolatile supply node receives a negative erase potential in an erase mode.

18. The circuit of claim 14, wherein:
the first power supply node receives a program set potential in the program mode, the program set potential being greater than the power supply potential.

19. The circuit of claim 18, wherein:
in the program mode
one nonvolatile device can receive the program set potential and the program potential; and
another nonvolatile device can receive a second power supply potential and the program potential.

20. The circuit of claim 14, wherein:
the nonvolatile devices are field effect transistors having a gate dielectric that includes a charge storing insulating layer, the nonvolatile devices having different threshold voltages in opposing states.

* * * * *